United States Patent [19]

Campbell

[11] Patent Number: 4,949,001

[45] Date of Patent: Aug. 14, 1990

[54] PARTIAL DISCHARGE DETECTION METHOD AND APPARATUS

[76] Inventor: Steven R. Campbell, 43 Methuen Avenue, Toronto, Ontario, Canada, M6S 1Z7

[21] Appl. No.: 383,026

[22] Filed: Jul. 21, 1989

[51] Int. Cl.$^5$ ............... H02K 3/487; G08B 21/00
[52] U.S. Cl. ............... 310/220; 310/68 C; 310/214; 324/546; 333/24 C
[58] Field of Search .............. 310/214, 220, 68 C; 324/140, 158 MG, 510, 545, 546; 361/31, 33; 333/24 C; 343/700 MS

[56] References Cited

U.S. PATENT DOCUMENTS

| | | | |
|---|---|---|---|
| 3,707,673 | 12/1972 | Carter | 324/140 |
| 3,775,676 | 11/1973 | Harrold et al. | 324/54 |
| 3,887,866 | 6/1975 | Safer et al. | 324/54 |
| 4,238,733 | 12/1980 | Freeman | 324/158 MG |
| 4,327,334 | 4/1982 | Becavin et al. | 333/24 C |
| 4,385,271 | 5/1983 | Kurtz et al. | 324/133 |
| 4,445,057 | 4/1984 | Küter et al. | 310/68 D |
| 4,539,499 | 9/1985 | Punch et al. | 310/214 |
| 4,779,051 | 10/1988 | Grünewald et al. | 324/158 MG |
| 4,853,818 | 8/1989 | Emery et al. | 324/546 |

*Primary Examiner*—Steven L. Stephan
*Assistant Examiner*—D. L. Rebsch
*Attorney, Agent, or Firm*—Ridout & Maybee

[57] ABSTRACT

A method and device for detecting a partial discharge pulse in a high voltage conductor in the stator of a motor, turbine generator or the like, comprising a conductive plate having an insulated face, an insulated signal conductor spanning the insulated face of the plate, and means for transmitting an electrical pulse produced in the signal conductor to recording means for determining the location and severity of partial discharge activity within the high voltage insulation of the conductor.

10 Claims, 3 Drawing Sheets

PARTIAL DISCHARGE DETECTION METHOD AND APPARATUS

FIELD OF THE INVENTION

This invention relates to a partial discharge detection method and apparatus for high voltage conductors.

In particular, this invention relates to a method and apparatus for detecting partial discharge in high voltage insulation surrounding stator windings of a motor, turbine generator or the like.

BACKGROUND OF THE INVENTION

Motors, generators and the like typically comprise a rotor rotatably mounted within a stator core. The stator core comprises stator windinqs consisting of insulated bundles of high voltage conductors, known as stator bars, embedded in slots in the stator core.

The insulation surrounding such high voltage conductors is subject to deterioration over time. Deterioration of the insulation surrounding a conductor can result in partial discharge activity within the insulation, which further deteriorates the insulation. Thus, a vicious circle is established, whereby as the insulation deteriorates partial discharge activity increases in severity and thus increases the rate of deterioration of the insulation. Eventually the insulated conductor experiencing such partial discharge activity must be replaced to avoid or correct a fault in the stator windings.

Replacement of a stator bar is a costly and time consuming process, requiring that the motor or generator be taken out of service and dismantled. Once a fault occurs in the stator windings, replacement must be effected in order to restore the motor or generator to operating condition. It is thus advantageous to be able to determine the condition of the insulation in the stator windings in advance in order to anticipate whether and approximately when repair will be necessary, so that repair can be effected in an orderly and organized fashion before the fault becomes catastrophic and at a time which is most convenient having regard to the operating schedule of the particular motor or generator concerned.

The severity of partial discharge activity in the stator windings is generally accepted as a good indicator of the condition of the high voltage insulation surrounding conductors in the windings. Previously, high voltage coupling capacitors have been employed at the point of energization of the stator windings to block the high 60 Hertz voltage while permitting any high frequency partial discharge signal to be coupled to a measuring instrument. Such capacitors are bulky and expensive, and require direct connection to the high voltage conductors of the windings, thus reducing the integrity of the motor or generator insulation system.

Moreover, such capacitors cannot distinguish between the high frequency partial discharge signals and background interference. Furthermore, where partial discharge activity is detected in this manner, its location and severity can only be determined by physical inspection, requiring that the motor or generator be taken out of service and dismantled.

The present invention overcomes these disadvantages by providing a partial discharge detection method and device adapted to detect partial discharge within a particular stator slot or adjacent stator slots from the region of the stator slot itself. The present invention thus not only detects partial discharge activity within a stator slot, but provides a good indication of the particular stator slot in which such partial discharge activity is occurring. The device is inherently insensitive to electrical interference which originates outside the stator slot and which can produce a misleading indication of the condition of the high voltage insulation.

This is accomplished in the present invention through a detection device comprising a signal conductor spanning a conductive ground plane adapted to transmit to a recording instrument such as an oscilloscope a signal electromagnetically coupled from high frequency components of a pulse generated by partial discharge activity within a stator slot. The detection device is installed in or adjacent to the stator slot, which effectively restricts the measurement of partial discharge activity to electrical activity occurring within that particular stator slot or a nearby stator slot.

Since high frequency signals are severely attenuated as they propagate within a stator slot, the signal conductor, designed to be sensitive only to high frequency signals, is sensitive only to partial discharge activity within the stator slot or a nearby stator slot, and is relatively insensitive to partial discharge activity originating elsewhere or background interference. The partial discharge detection device and method of the present invention can thus distinguish between partial discharge signals and background interference. Moreover, since there is no direct connection to any high voltage conductor in the stator windings, there is no effect upon the integrity of the motor or generator insulation system. The partial discharge detection device of the present invention is also relatively small, inexpensive and relatively simple to install.

A partial discharge detection device embodying the present invention may be implemented into the construction of a stator, or may be retrofitted to existing stator cores which have heretofore relied upon high voltage coupling capacitors to detect partial discharge activity. A preferred embodiment of the invention provides a relatively slender conductive ground plane and signal conductor, which will easily fit within the clearance between the rotor and the stator core of an existing motor or generator without adversely affecting the operation thereof.

SUMMARY OF THE INVENTION

The present invention thus provides a detector for detecting a partial discharge pulse in a high voltage conductor comprising a conductive plate having an insulated face, an insulated signal conductor spanning at least a portion of the insulated face, means for recording an electrical pulse and means for transmitting the electrical pulse from the signal conductor to the recording means whereby partial discharge along the high voltage conductor electromagnetically induces a pulse in the signal conductor which is transmitted to the recording means.

The present invention further provides a method for detecting partial discharge activity in a high voltage conductor utilizing said detector comprising locating the conductive plate in proximity to the high voltage conductor; measuring the frequency and voltage of a pulse produced in the signal conductor; and comparing the measured frequency and voltage with predetermined values to determine the nature, magnitude or location of the partial discharge activity.

BRIEF DESCRIPTION OF THE DRAWINGS

In drawings which illustrate by way of example only a preferred embodiment of the subject invention.

DETAILED DESCRIPTION OF THE INVENTION

Figure 1:
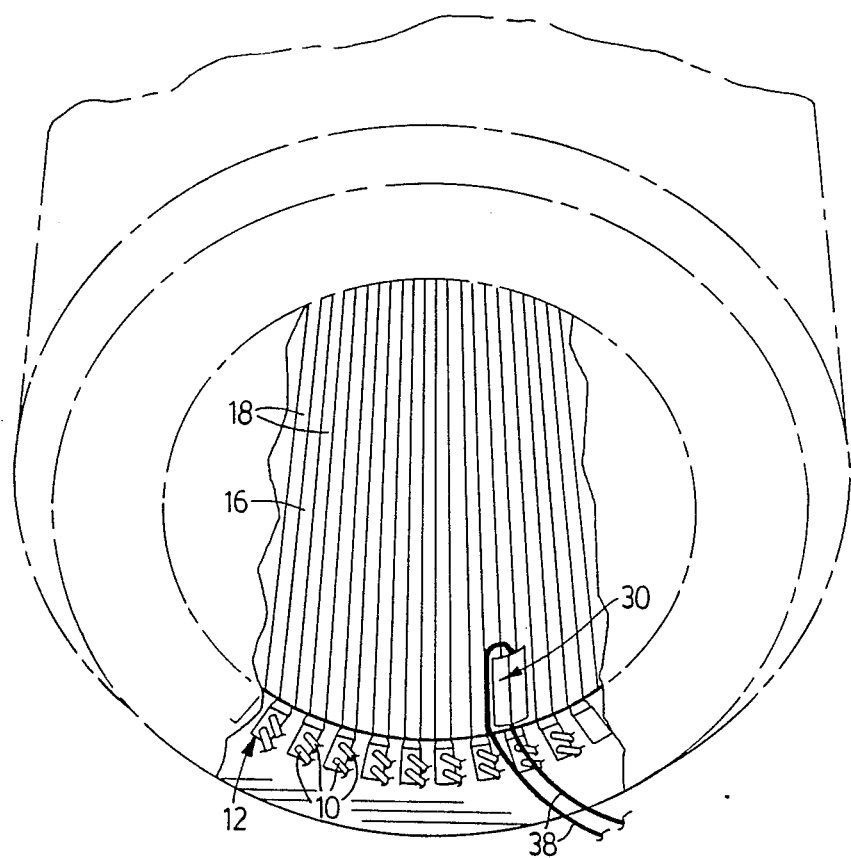
FIG. 1 is a partial perspective view illustrating the stator of a typical motor or generator.
Figures 3, 5:
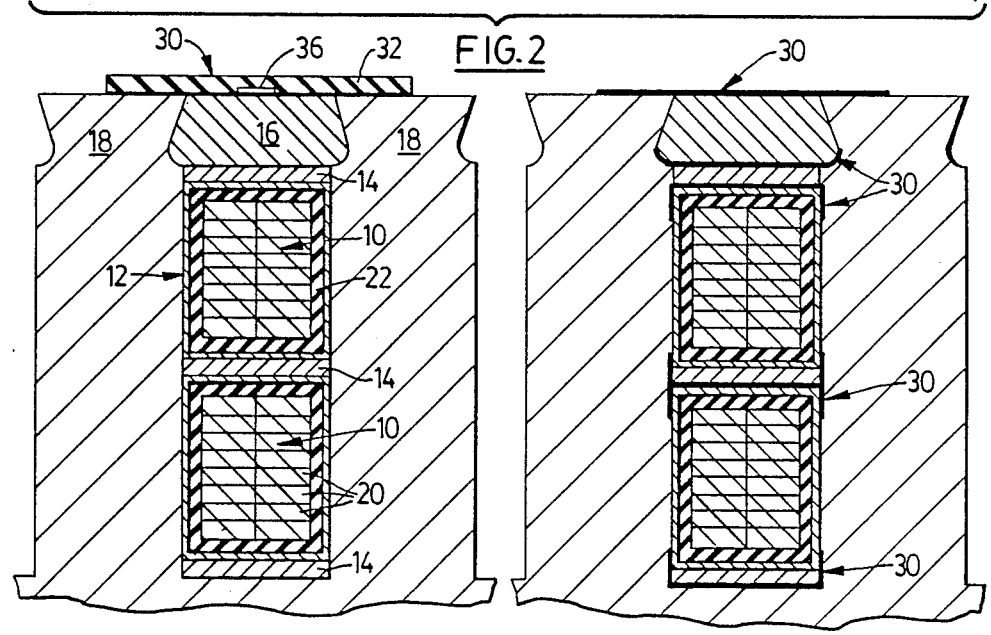
FIG. 3 is a cross-sectional view of a stator slot within the stator core of FIG. 1, illustrating a preferred position for installation of the partial discharge detection device of the present invention.
FIG. 5 is a cross-sectional view of a stator slot illustrating alternative preferred positions for installation of the partial discharge detection device of the present invention.

Referring to FIG. 1, illustrated is a section of a typical stator core in a motor or generator. The stator windings typically comprise pairs of stator bars 10 embedded in slots 12 in the stator core. The stator bars 10 may be surrounded by depth packing material 14 and are snugly retained in position by a wedge 16 inserted between two teeth 18 of the stator core, as illustrated in FIG. 3.

The stator bars 10 each typically comprise bundles of conductive strands 20 surrounded by high voltage insulating material 22, which in turn is coated with semiconductive paint or tape (not shown) grounded to the stator core. The stator bars 10 are electrically connected in known fashion to form the stator windings.

Figure 4:
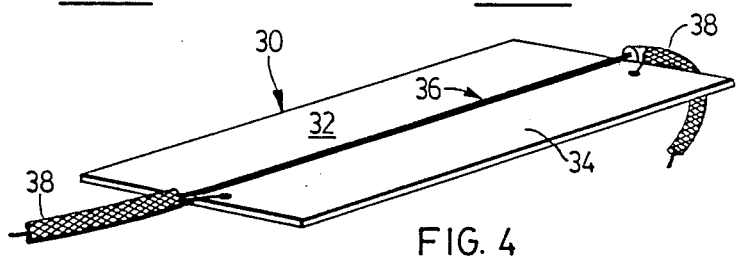
FIG. 4 is a perspective view of the partial discharge detection device illustrated in FIG. 3.

The partial discharge detection device 30 of the present invention, illustrated in FIG. 4, comprises a plate 32 of conductive material, such as copper, with insulation, such as TEFLON (trade mark) or an electrically insulating epoxy, covering at least one face 34 thereof. An insulated signal conductor 36, comprising a preferably slender wire whose length is selected according to the pulse frequency desired to be detected, spans at least a portion of the insulated face 34 of the plate 32. In general, better coupling is achieved when the plate 32 and signal conductor 36 are composed of highly conductive materials.

Transmitting means, which preferably comprise lengths of coaxial cable 38, are preferably connected to each end of the signal conductor 36 such that the central conductor of each coaxial cable 38 is in electrical contact with one end of the signal conductor 36, and the outer conductor of the coaxial cable 38 is in electrical contact with the plate 32. The other end of each coaxial cable 38 is suitably connected to means for recording an electrical pulse, such as a high frequency oscilloscope (not shown).

The width of the signal conductor 36 and its distance from the plate 32 can be chosen according to known principles of transmission line theory to exhibit a characteristic impedance equivalent to that of the cable 38.

Figure 2:
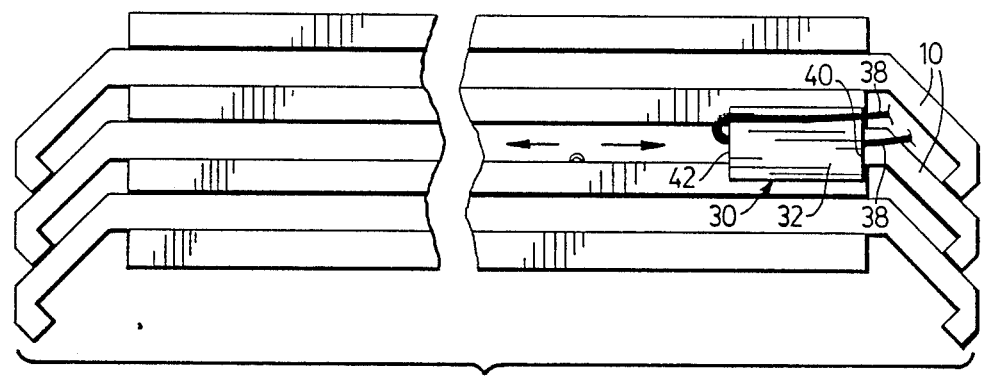
FIG. 2 is a sectional top plan view of a portion of the stator core of FIG. 1 with wedges removed.

When partial discharge activity occurs within the stator slot 12, a high frequency pulse propagates in both directions along the slot 12 away from the site of the partial discharge, as notionally illustrated in FIG. 2. An electromagnetic field is thus created, which surrounds the stator bar 10 in which the partial discharge activity is occurring.

With the detection device 30 installed such that the signal conductor 36 is positioned parallel to the stator bar 10 within or adjacent to the stator slot 12, the electromagnetic field produces a signal in the signal conductor 36 corresponding to the high frequency components of the partial discharge pulse, but in the direction opposite to the direction of propagation of the component of the partial discharge pulse propagating past the detection device, according to known directional coupler effects. The signal thus produced in the signal conductor 36 is transmitted along the coaxial cable 38 to the oscilloscope or other recording device, which can display a graphical representation of the signal. Interpretation of this signal, described in greater detail below, provides an indication of the location and severity of the partial discharge activity, and hence the condition of the high voltage insulation 22 within the stator slot 12.

The stator core and the plate 32 of the detection device 30 together serve as a ground plane to the partial discharge pulse and the signal produced in the signal conductor 36. The resultant directional coupling of the partial discharge pulse to the signal conductor 36 produces a signal in the signal conductor 36 which is in essence the superposition of a capacitively coupled signal between the affected stator bar 10 and the signal conductor 36, which propagates in both directions along the signal conductor 36, and an inductively coupled signal between the affected stator bar 10 and the signal conductor 36, which propagates along the signal conductor only in the direction opposite to the direction of the partial discharge pulse propagating past the detection device 30. The result is essentially a cancellation of the inductively coupled signal and the capacitively coupled signal at the far end 40 of the signal conductor 36, the end furthest from the point of partial discharge activity, and a superposition of the capacitively coupled signal and the inductively coupled signal at the near end 42 of the signal conductor, the end closest to the point of partial discharge activity. The net signal directionally coupled to the signal conductor 36 and displayed by the oscilloscope, based on the point of partial discharge activity illustrated in FIG. 2, is represented graphically in FIG. 6.

A single coaxial cable 38 connected to only one end of the signal conductor 36 may enable the detection device to detect partial discharge activity, although it is expected that the information which could be imparted by such a detection device will not be as detailed as that from the preferred embodiment, which as indicated above comprises a cable 38 connected to each end of the signal conductor 36.

In theory, superposition of the capacitively coupled signal and the inductively coupled signal would result in complete cancellation of the signals at the far end 40 of the signal conductor 36. However, measurements of partial discharge propagation in the stator slot 12 indicate that there is significant attenuation within the slot 12, even as the pulse propagates past the detection device 30, and the cancellation is therefore not complete. The pulse produced at the far end 40 of the signal conductor 36 is reduced and of a polarity opposite to that of the component of the partial discharge pulse propagating past the detection device 30. In the example illustrated in FIG. 2, for example, the inductively coupled signal would be slightly higher than the capacitively coupled signal. In interpreting the results displayed by the recording device, therefore, one can distinguish between background interference and partial discharge activity, to the point of being able to determine whether the pulses are originating within the slot 12, within a nearby slot 12 or outside of the stator core.

Since partial discharge pulses ordinarily have a short duration, such pulses will have component frequencies in excess of 150 megaHertz, and are thus easily detected by a relatively short signal conductor 36, for example, 0.4 meters. Because signals with such high frequencies rapidly attenuate as they propagate along the stator bar 10, the detection device 30 will be sensitive to partial discharge activity within the stator slot 12, and will be less sensitive to partial discharge activity or background interference which originates outside of the slot 12. Signals originating from a nearby slot 12 may be detected, however they will be of considerably lower magnitude and different waveshape and are thus distinguished from the pattern of a signal originating within the slot 12.

The signal conductor 36 must not be too short, however, since attenuation within the stator slot 12 increases with the frequency of the signal sought to be detected. Therefore, if the signal conductor 36 is too short, the detection device 30 will be unable to detect partial discharge activity at an axially remote location of the stator slot 12 because the frequencies able to be detected by such a signal conductor 36 will substantially or completely attenuate before reaching the detection device 30. Thus, it is believed that through experimentation the frequency content of the pulses detected may be used to determine the axial proximity of the partial discharge activity to the detection device 30, once the attenuation characteristics of the stator slot are known. In general, as the distance between the partial discharge activity and the detection device 30 increases, the high frequency content of the detected pulse is reduced.

The signal conductor 36 should similarly not be too long, since lower frequency partial discharge signals, which do not attenuate significantly within the slot 12, will then be difficult to distinguish from partial discharge activity or low frequency background interference originating outside of the slot 12.

In all cases the signal conductor 36 must not overextend the plate 32, and preferably the ends of the plate 32 extend slightly past the ends 40, 42 of the signal conductor 36 to ensure proper directional coupling.

First principles would suggest that the signal conductor 36 will not be sensitive to partial discharge activity within the high voltage insulation 22, since a Faraday shield formed by the grounded semiconductive paint or tape exists around each stator bar 10 and the electromagnetic pulse should thus be blocked from capacitive coupling with the signal conductor 36. However, it has been determined that a typical semiconductive coating surrounding the stator bar 10 is transparent to high frequency pulse signals, herein referring to signals of a frequency greater than 100 megaHertz, thus permitting directional coupling of high frequency signals between the stator bar 10 and the signal conductor 36 of the detection device 30.

FIG. 4 illustrates a preferred embodiment of the detection device 30 for retrofitting to existing motors or generators. The plate 32 is large enough to span the width of a stator slot 12 and at least a portion of one tooth 18 of the stator core, forming a ground plane. It can be affixed to the stator core by epoxy or other known means, with the signal conductor 36 and insulated face 34 abutting the stator core. The characteristic impedance is selected at 50 ohms, to correspond to the impedance of the coaxial cable 38, although this impedance can be altered to alter coupling efficiency according to known principles. In fact, in this embodiment more slender transmitting means 38 may be preferred, given the limited clearance between the stator core and the rotor of a typical motor or generator. Both the plate 32 and the signal conductor 36 are preferably also slender, and are preferably individually laminated or otherwise coated with a TEFLON (trade mark) coating or other insulating coating to keep thickness to a minimum. This embodiment of the detection device 30 can be placed directly over the stator slot 12, as illustrated in FIG. 3, fitting within the clearance typically available between the rotor and the stator core. Thus, existing stator cores may be readily retrofitted with the detection device 30 so described without interfering adversely with the operation of the motor or generator.

The detection device 30 is retrofitted on the stator core with the signal conductor 36 parallel to and overlapping a stator slot 12, and the insulated face 34 of the plate 32 overlaying at least a portion of one tooth 18 of the stator core, as illustrated in FIG. 3. The detection device 30 may be so installed at any location axially along the stator slot 12, however it is advantageous to locate the detection device 30 over a physically convenient end of the stator slot 12 for ease of installation and access.

Because various thicknesses of the insulated face 34 may be accommodated without changing the operation of the detection device 30, any number of other suitable locations for the detection device 30 may be preferred. For example, as illustrated in FIG. 5, the detection device 30 may be built into or around the wedge 16 or the depth packing material 14 above, below or in between the top and bottom stator bars 10. Thickness may be selected as is convenient for the chosen installation.

It is to be noted that the aforesaid description of the operation of the present invention is intended to notionally illustrate the operation of the invention as understood by the inventor, and is not intended to accurately describe directional coupler theory. For purposes of interpreting the results of the detection method described herein, it is convenient to break down the directionally coupled signal into inductively coupled and capacitively coupled components. The inventor does not represent that directional coupling between the stator bar 10 and the signal conductor 36 actually occurs in this fashion, however by simplifying it in this manner the results achieved are more readily construed.

Figure 6:
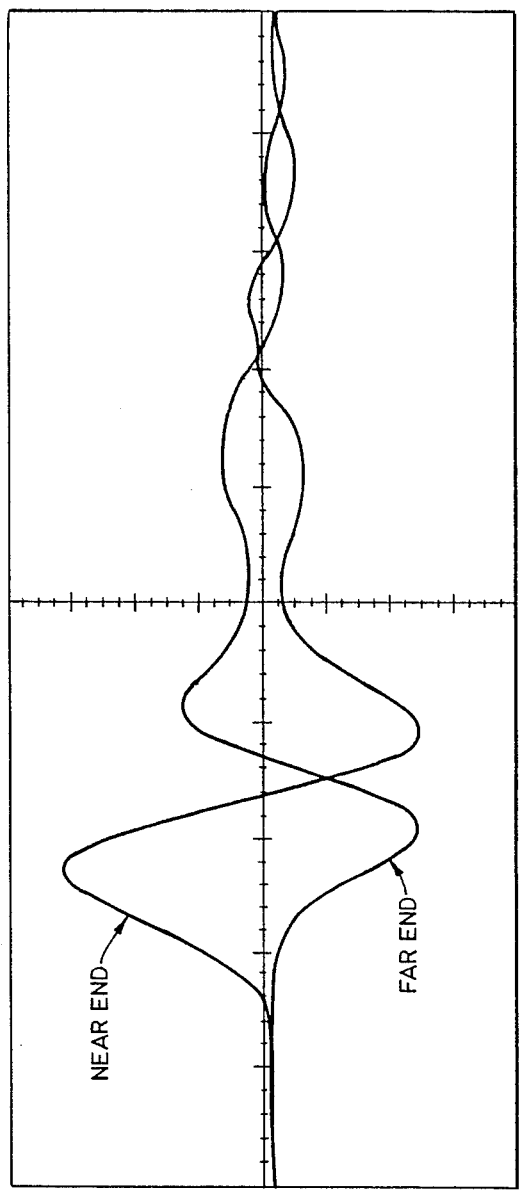
FIG. 6 is a cartesian diagram illustrating a partial discharge pulse detected by the partial discharge detection device of FIG. 4.

For example, FIG. 6 illustrates the graphical representation of the directionally coupled signal produced by a partial discharge pulse located as illustrated in FIG. 2. At the near end 42 of the signal detector 36, toward which the inductively coupled signal is propagating, the capacitively coupled signal is superposed on the inductively coupled signal yielding a net pulse of more than 600 mvolts. At the far end 40 of the signal detector 36, the inductively coupled signal is partially cancelled by the capacitively coupled signal, yielding a net pulse of just over 400 mvolts of the opposite polarity. If the partial discharge activity were occurring outside the slot 12, the magnitudes of these readings would be considerably diminished and they would exhibit a different waveshape.

These results should consistently vary with the magnitude of the partial discharge activity and its proximity to the signal detector 30. It can thus be seen that these variables should be predictable to a fair degree of accuracy by comparing readings of the directionally coupled pulse to values determined through experimentation.

Figure 7:
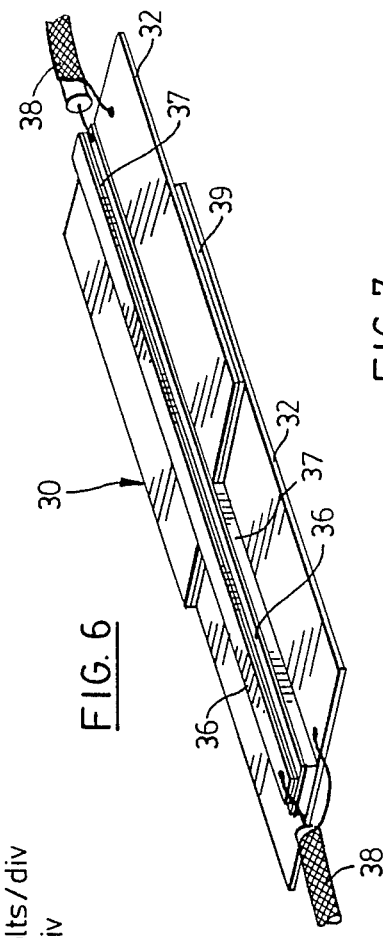
FIG. 7 is a perspective view of another preferred embodiment of a partial discharge detection device according to the present invention.

In a further preferred embodiment of the present invention, illustrated in FIG. 7, the detection device comprises two electrically conductive plates 32 arranged in overlapping relation and having an insulating layer 39 between the overlapping portions of the plates 32. A pair of signal conductors 36 spans the combined length of the plates 32 and is electrically insulated therefrom. The signal conductors 36 are electrically insulated from each other by an insulating layer 37. Transmitting means 38 comprises coaxial cables, one of which is connected to a first plate 32 and a first signal conductor 36 in the manner hereinbefore described, and the other cable is connected at the other end of the length of the device to the second plate 32 and the second signal conductor 36.

In this embodiment, there is no direct connection between the cables at each end of the device, which prevents circulating power frequency currents that may arise in the first embodiment of the invention because of the presence of a conductive loop within the strong magnetic field of the stator core.

Having thus described the preferred embodiment of the subject invention, it will be obvious to those skilled in the art that variations and modifications may be made thereto without departing from the scope of the claims. It is intended to include all such variations and modifications as fall within the scope of the appended claims.

I claim:

1. A detection device for detecting a partial discharge pulse in a high voltage conductor comprising:
    a conductive plate having an insulated face;
    an insulated signal conductor spanning a portion of the insulated face and electrically insulated from the conductive plate;
    means for recording an electrical pulse; and
    means for transmitting the electrical pulse from the signal conductor to the recording means
    whereby partial discharge activity along the high voltage conductor is directionally coupled to the signal conductor inducing a pulse which is transmitted to the recording means.

2. A detection device as defined in claim 1 wherein means for transmitting the electrical pulse from the signal conductor to the recording means are connected to both ends of the signal conductor.

3. A detection device as defined in claim 1 in which the recording means includes an oscilloscope.

4. A detection device as defined in claims 1, 2 or 3 further comprising:
    a second conductive plate having an insulated face, overlapping the first conductive plate and insulated therefrom;
    a second insulated signal conductor adjacent to the first signal conductor and electrically insulated therefrom;
    wherein transmitting means is electrically connected to the first plate and the first signal conductor at one end thereof, and separate transmitting means is electrically connected to the second plate and the second signal conductor at an opposite end thereof.

5. A method for detecting partial discharge activity in a high voltage conductor utilizing the detection device defined in claim 1 comprising:
    locating the conductive plate in proximity to the high voltage conductor;
    measuring the frequency and voltage of a pulse produced in the signal conductor; and
    comparing the measured frequency and voltage with predetermined values to determine the nature, magnitude or location of the partial discharge activity.

6. The method as defined in claim 5 wherein the high voltage conductor is a stator bar.

7. The method as defined in claims 5 or 6 wherein transmitting means are connected to each end of the signal conductor and measurements of the pulse produced at each end of the signal conductor are taken.

8. A method for detecting partial discharge activity in a stator bar in a motor or turbine generator or the like utilizing the detection device defined in claim comprising:
    affixing the conductive plate adjacent to a stator slot with its insulated face abutting the stator core and the signal conductor parallel to the stator slot;
    measuring the voltage and frequency of a pulse produced in the signal conductor; and
    comparing such measurements with predetermined values to determine the nature, magnitude or location of partial discharge activity.

9. The method as defined in claim 8 wherein the high voltage conductor is a stator bar.

10. The method as defined in claims 8 or 9 wherein transmitting means are connected to each end of the signal conductor and measurements of the pulse produced at each end of the signal conductor are taken.

* * * * *